United States Patent
Moon et al.

(10) Patent No.: US 6,524,880 B2
(45) Date of Patent: Feb. 25, 2003

(54) SOLAR CELL AND METHOD FOR FABRICATING THE SAME

(75) Inventors: In-Sik Moon, Kyungki-do (KR); Dong-Seop Kim, Seoul (KR); Soo-Hong Lee, Suwon (KR)

(73) Assignee: Samsung SDI Co., Ltd., Kyungki-do (KR)

( * ) Notice: Subject to any disclaimer, the term of this patent is extended or adjusted under 35 U.S.C. 154(b) by 0 days.

(21) Appl. No.: 09/912,061

(22) Filed: Jul. 25, 2001

(65) Prior Publication Data

US 2002/0153039 A1 Oct. 24, 2002

(30) Foreign Application Priority Data

Apr. 23, 2001 (KR) .............................. 01-21734
Jun. 1, 2001 (KR) .............................. 01-30880

(51) Int. Cl.$^7$ .............................................. H01L 31/04
(52) U.S. Cl. .................... 438/57; 438/98; 438/558; 438/563; 438/756; 136/249; 136/255; 136/256
(58) Field of Search ..................... 438/57, 923, 756, 438/705, 537, 542, 548, 558, 98, 563; 136/249, 255, 256

(56) References Cited

U.S. PATENT DOCUMENTS

| | | | | |
|---|---|---|---|---|
| 4,070,689 A | * | 1/1978 | Coleman et al. ............ 136/255 |
| 4,104,091 A | * | 8/1978 | Evans et al. ................... 438/57 |
| 6,071,753 A | * | 6/2000 | Arimoto ....................... 438/57 |
| 6,280,651 B1 | * | 8/2001 | Wojtczak et al. ........... 252/79.1 |
| 6,291,763 B1 | * | 9/2001 | Nakamura ................... 136/256 |

OTHER PUBLICATIONS

Zhao et al. "Improved Efficiency Silicon Solar Cell Module" IEEE Electron Device Letters, vol. 18, No. 2, Feb. 1997. pp. 48–50.*

* cited by examiner

Primary Examiner—Nam Nguyen
Assistant Examiner—Brian L. Mutschler
(74) Attorney, Agent, or Firm—Robert E. Bushnell, Esq.

(57) ABSTRACT

A technique for fabricating a solar cell includes an $n^+$ emitter region first being formed on a front surface of the cell, and then front and rear insulating layers being formed on both sides of the cell. P (Phosphorus)-source and B (Boron)-source are printed on the front and rear insulating layers, respectively, and then both dopants are diffused into the cell at high temperature. Therefore, $n^{++}$ region in the front side of the cell and BSF (back surface field) region in the rear side of the cell is formed. Front and rear contact patterns are formed on the front and rear insulating layers, respectively. The $n^{++}$ region and BSF region are exposed after front and rear contacts are formed on the front and rear insulating layers, respectively. The front and rear contacts contact the $n^{++}$ region and BSF region, respectively.

15 Claims, 6 Drawing Sheets

SOLAR CELL AND METHOD FOR FABRICATING THE SAME

CLAIM OF PRIORTY

This application makes reference to, incorporates the same herein, and claims all benefits accruing under 35 U.S.C. § 119 from an application entitled *Solar Cell and Method for Fabricating the Same* earlier filed in the Korean Industrial Property Office on Apr. 23, 2001 and there duly assigned Ser. No. 2001-21734 by that Office and earlier filed in the Korean Industrial Property Office on Jun. 1, 2001 and there duly assigned Ser. No. 2001-30880 by that Office.

BACKGROUND OF THE INVENTION

1. Field of the Invention

The present invention relates to a solar cell and a method for fabricating the solar cell using a screen-printing method.

2. Description of the Background Art

A solar cell includes a junction of an n-type and a p-type semiconductor (p-n junction). In the cell, electron-hole pairs are generated by incident light and move toward n-type and p-type region and then accumulated in two contacts. When light shining on the solar cell produces both a current and a voltage, the light-generated current and voltage can be used as electric power.

In a solar cell, n-type and p-type impurities are doped on the front and rear surface of a Si (Silicon) substrate for making a p-n junction and contacts formed on both surfaces. To fabricate a solar cell, oxide layers are formed and etched with predetermined patterns by costly photolithography process on each of the surfaces of a Si (Silicon) substrate, and impurities are doped through the patterned area. Contact layers are then formed on the patterned area.

Techniques for fabricating such a solar cell are disclosed in many articles. For example, *The range of high-efficiency silicon cells fabricated at Fraunhofer ISE* by S. W. Glunz, J. Knobloch et al, in 26$^{th}$ PVSC, 1997, pp. 231–234, or *High efficiency solar cells from FZ, CZ, and MC silicon material* by J. Knobloch, A. Noel et al, in 23rd IEEE PVSEC, 1993, pp. 271–276.

U.S. Pat. Nos. 5,258,077 issued to Shahryar for *High Efficiency Silicon Solar Cells and Method of Fabrication* and 3,988,167 issued to Kressel et. al. for *Solar Cell Device having Improved Efficiency* disclose solar cells with increased efficiency.

In the former, U.S. Pat. Nos. 5,258,077 issued to Shahryar, a groove is formed on a front surface of a textured silicon substrate by laser to enlarge contact area and reduce the contact resistance of contact, thereby improve the efficiency. In the latter, U.S. Pat. No. 3,988,167 issued to Kressel et. al., oxide layers with a plurality open areas are formed on front and rear surfaces of a Si (Silicon) substrate, and contacts are formed on the open area. The rear contact is formed of a material that can enhance the light absorption, thereby improving the efficiency.

However, the above techniques use several photo-etching processes, which is costly and time-consuming.

SUMMARY OF THE INVENTION

It is therefore an object of the present invention to provide a technique for fabricating a solar cell that can simplify the manufacturing process and minimize the manufacturing costs by forming a doped layer on a substrate using a screen printing process.

It is another object to increase the efficiency of a solar cell.

It is yet another object to avoid the use of the costly photo-etching process to fabricate a solar cell.

To achieve the above objects, the present invention provides a technique for fabricating a solar cell. $n^+$ emitter layers are formed on a front surface of a p-type substrate. Dielectric layers, $SiO_2$ (silicon dioxide) for surface passivation are formed on the front and rear surfaces of the substrate. On the $SiO_2$ layers, n-type dopant source is printed on the front surface and p-type dopant source is printed on the rear surface. Both dopant sources are only printed on the area which will be patterned for forming a metal contact. At high temperature, both sources diffuse into the substrate, thereby forming heavily doped $n^{++}$ layers on the front surfaces and a heavily doped $p^{++}$ layers on the rear surface. The $SiO_2$ layers are etched away in chemical etching solution. The dopant printed $SiO_2$ layers are removed and the other $SiO_2$ layers remain. The removed areas on both heavily doped layers are used as patterns for metal contact. Front and rear contacts are formed.

Preferably, the front and rear contact patterns are formed by wet-etching PSG (phosphosilicate glass) and BSG (borosilicate or boronsilicate glass) layers formed on the front and rear insulating layers during the step of diffusing both printed dopant sources.

Further preferably, the front and rear contacts are formed at the same time. The front and rear contacts are formed by one of either a electroless plating method or an electroplating method. The front and rear insulating layers are formed through a thermal-oxidation process.

Further, preferably, the thickness of insulating layers is thinner than 800 Å (Angstroms).

According to another aspect, the present invention provides high-efficiency by including selective emitter, both $n^+$ emitter and $n^{++}$ layer under the front metal contact, and back surface field (BSF) layer under the rear metal contact.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENTS

Figure 1:
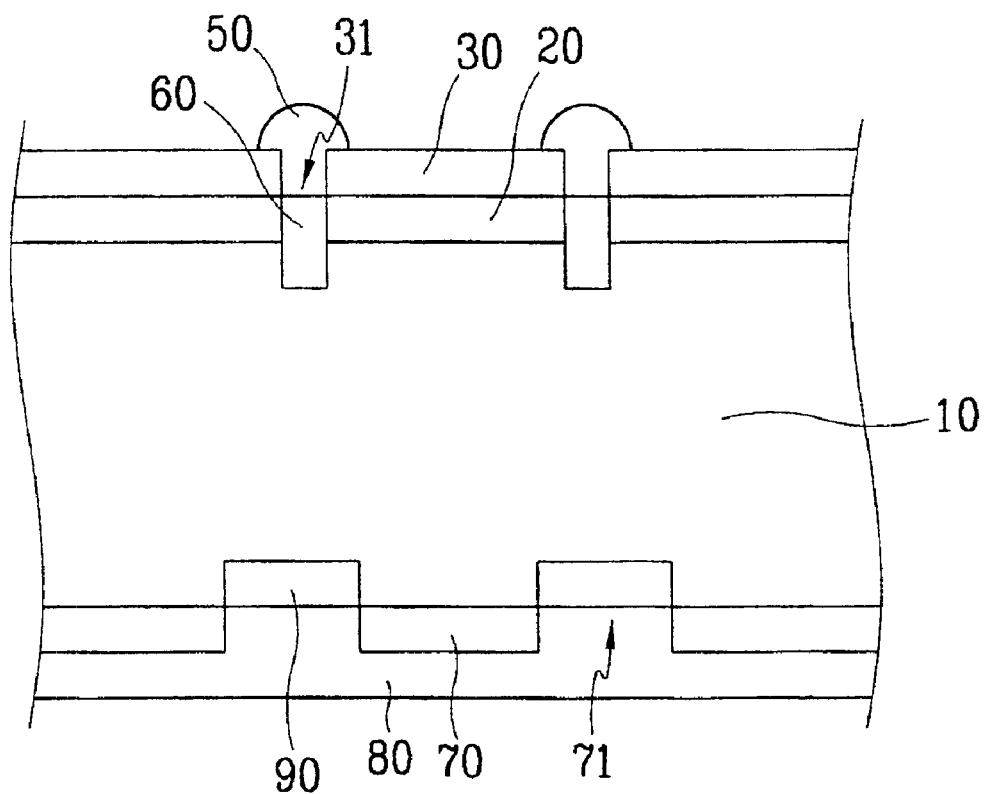
FIG. 1 is a sectional view of a solar cell according to a preferred embodiment of the present invention.
Figure 3:
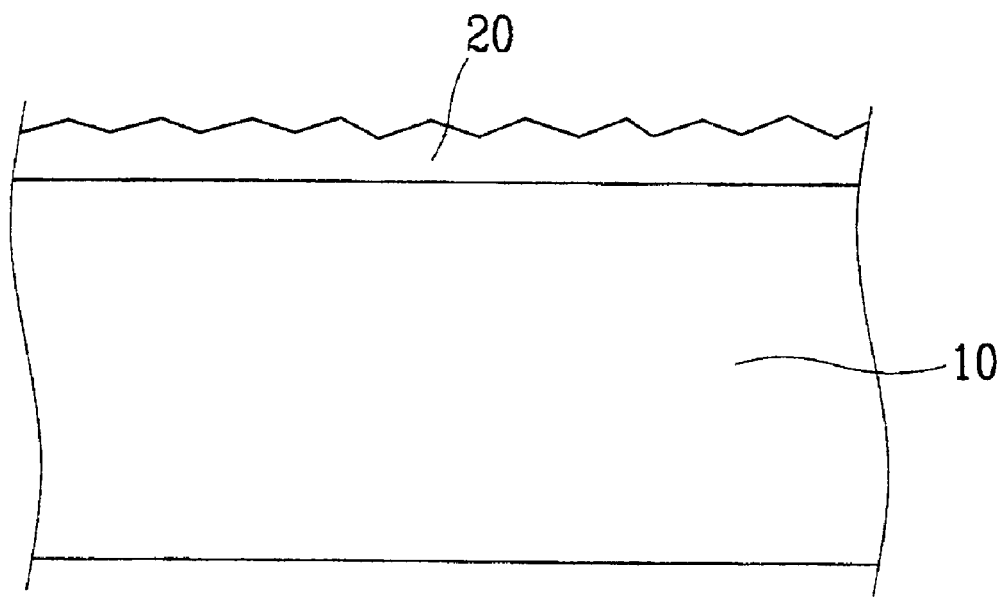
FIG. 3 is an alternate sectional view of FIG. 2a with a solar cell having a substrate that has a pyramidal shape.

Turning now to the drawings, referring to FIG. 1, a front surface of the p-type substrate 10 may have pyramidal shape as seen in FIG. 3 that enhances the light absorption compared with a flat surface. On the front surface of a p-type silicon substrate 10, n-type impurities, phosphorus (P) are doped so as to define an $n^+$-layer 20, a front insulating layer 30 having silicon oxide formed on the $n^+$-layer 20. In addition, $n^{++}$-layer 60, heavily doped area is formed, and then contact patterns 31 are formed to expose the $n^{++}$-layer 60. A front contact 50 is formed on the insulating layer 30 such that it can contact the $n^{++}$-layer 60 through the contact patterns 31. The $n^{++}$-layer 60 reduces the resistance between the front contact 50 and the silicon substrate 10. The front contact 50 collects and transmits light-generated carriers in the cell to an outer terminal. The front contact 50 includes conductive metal formed on the contact patterns by an electroplating method appropriate for plating patterned area, or an electroless plating method.

The $p^{++}$-layer 90, heavily doped area of p-type substrate is formed and rear contact 80 is formed on the $p^{++}$-layer 90 through contact patterns 71 in the rear insulating layer 70.

A method for fabricating the above-described solar cell will be described hereinafter with reference to FIG. 1 and FIGS. 2a to 2d.

Figure 2A:
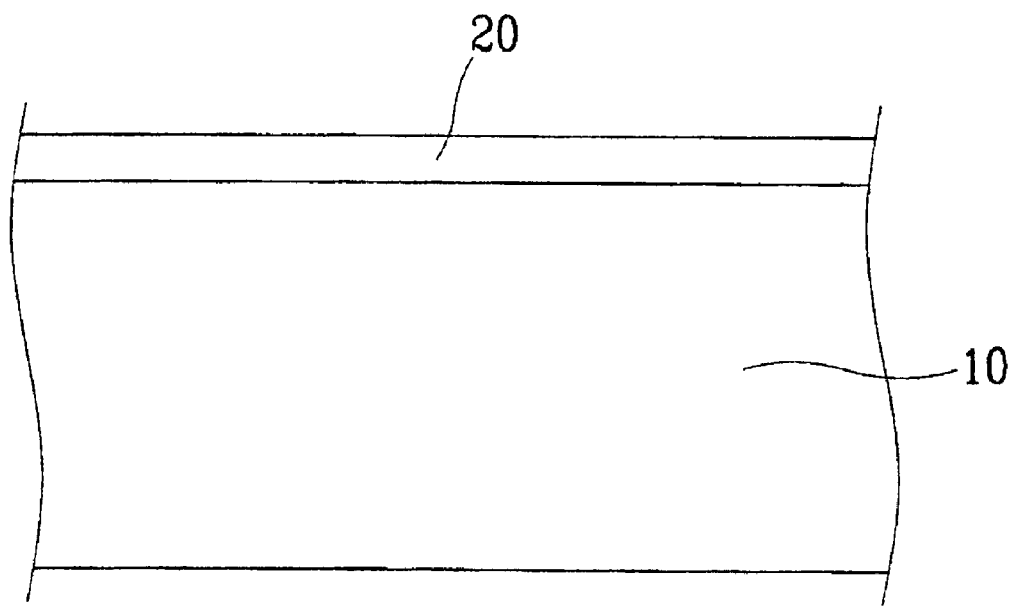
FIGS. 2a to 2d are sectional views of a solar cell on each step of a fabricating process thereof according to a preferred embodiment of the present invention.

Referring first to FIG. 2a, the n+-layer 20 is first formed by diffusing n-type impurity such as phosphorus on the front surface of the substrate 10. As phosphorus doping source, $POCl_3$ or $P_2O_5$ may be used. The silicon substrate 10 may be wet-etched to have pyramidal shaped surface before the doping process as seen in FIG. 3.

Figure 2B:
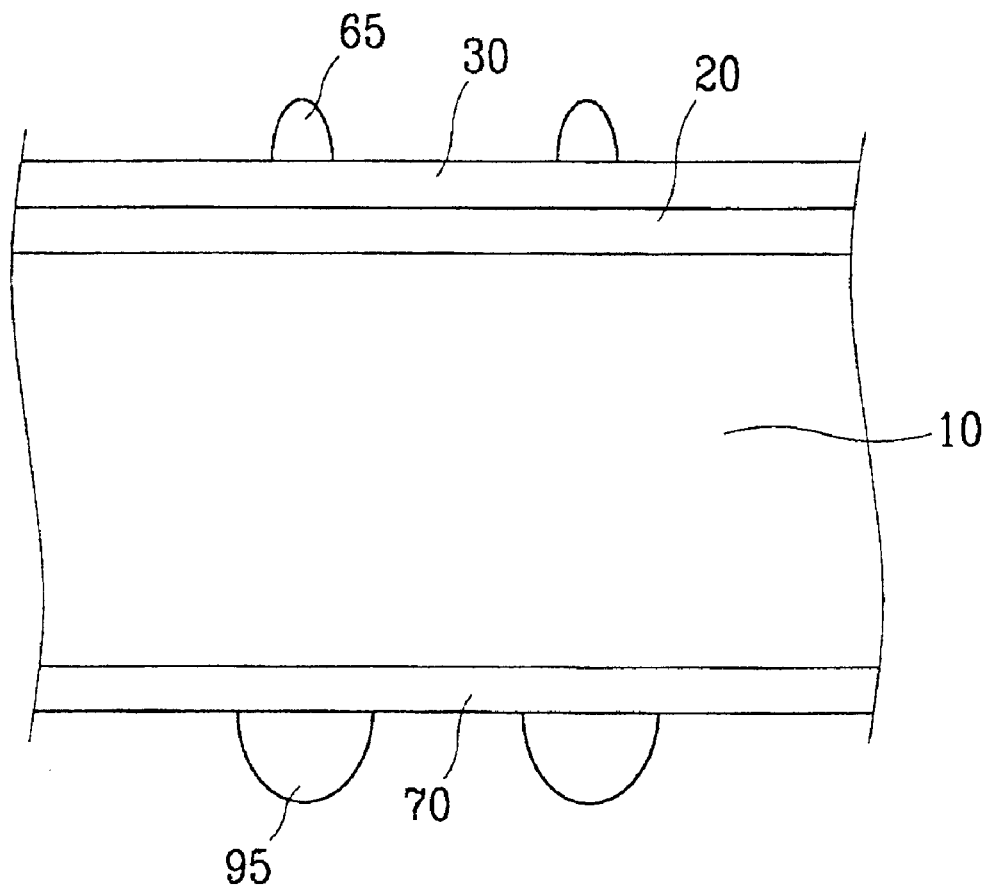

Next, as shown in FIG. 2b, the front and rear insulating layers 30 and 70 are formed on the front and rear surfaces of the substrate 10 through thermal-oxidation process. The front and rear insulating layers 30 and 70 function as anti-reflection layers, and the preferable thickness is about 250–750 Å so that the n-type or p-type impurities can be sufficiently diffused therein during the heat-treatment of the following process. Then, $P_2O_5$ and $B_2O_3$ are respectively printed on front and rear surfaces of the substrate 10 with a screen printing method to form heavily doped layers. Other types of printing methods may also be used such as gravure or specifically photogravure.

Figure 2C:
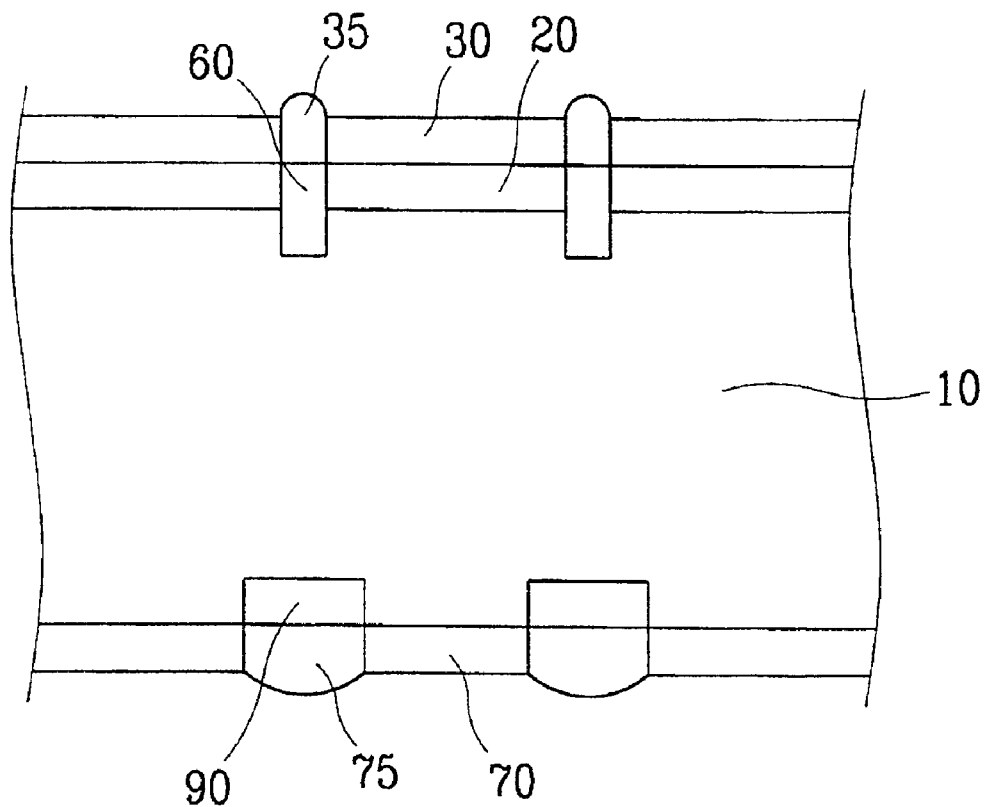

Next, as shown in FIG. 2c, heat-treatment is performed at high temperature such that the n-type (P) and p-type (B) impurity 65 and 95 diffuse into the substrate 10, thereby forming the $n^{++}$-layer 60 and the $p^{++}$-layer 90 on the front and rear surfaces of the substrate 10, respectively. Here, the $p^{++}$-layer 90 acts as a back surface field (BSF) which repels majority carrier from heavily doped region to bulk region thereby increasing open-circuit voltage of the cell. At this point, parts of the front and rear insulating layers 30 and 70 react with n-type and p-type impurities to form a phosphosilicate glass (PSG) layer 35 and a boronsilicate glass (BSG) layer 75 on the $n^{++}$-layer 60 and the $p^{++}$-layer 90, respectively. The widths of the PSG and BSG layers 35 and 75 are respectively identical to those of the $n^{++}$-layer 60 and the $p^{++}$-layer 90.

Figure 2D:
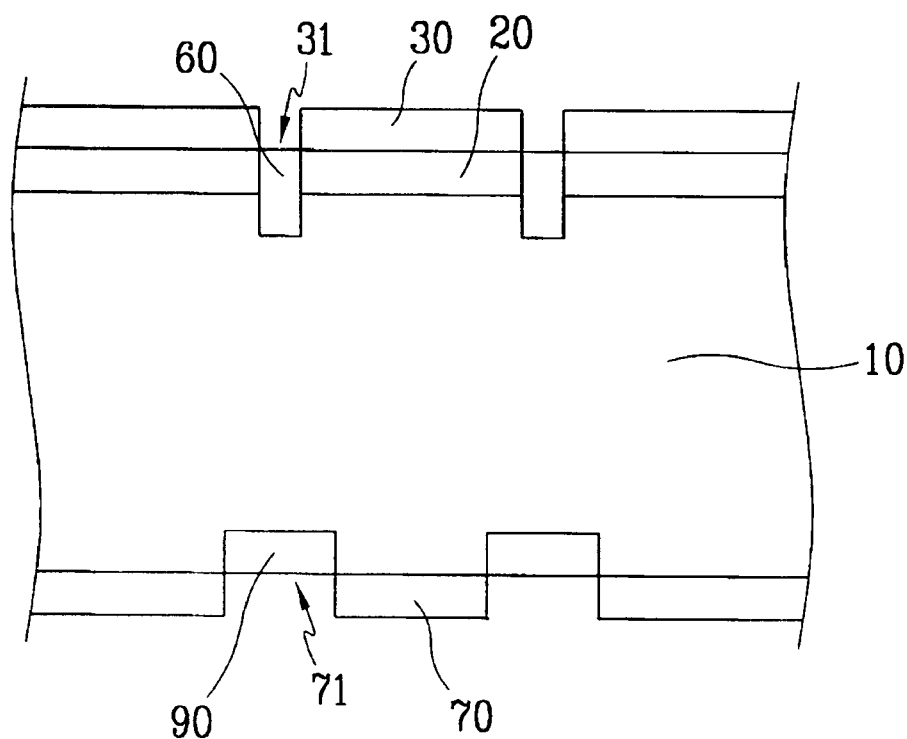

After the above, as shown in FIG. 2d, the PSG (phosphosilicate glass) and BSG (borosilicate glass) layers 35 and 75 are removed and the $n^{++}$-layer 60 and the $p^{++}$-layer 90 are exposed by wet-etching process, as a result, contact patterns 31 and 71 are defined. Since the etching rate of the PSG and BSG layers 35 and 75 is higher than that of the respective insulating layers 30 and 70, the PSG and BSG layers 35 and 75 can be easily removed without additional patterning process. The main ingredient of etching solution is HF. The concentration of the HF can be adjusted to acquire a proper etching rate. At 10% of HF, the etching rate of the insulating layers 30 and 70 is about 600 Å/min and the etching rate of the PSG and BSG layers 35 and 75 is about 1200~1800 Å/min. Thus, PSG and BSG layers 35 and 75 will be removed and contact patterns 31 and 71 are formed without additional patterning process. The resultant width of the patterns is substantially same as the width of corresponding $n^{++}$-layer 60 and the $p^{++}$-layer 90.

Next, as shown in FIG. 1, the front and rear contacts 50 and 80 are respectively formed on the insulating layers 30 and 70 such that they respectively contact the $n^{++}$-layer 60 and the $p^{++}$-layer 90 through the respective contact patterns 31 and 71. The front and rear contacts 50 and 80 are formed by plating conductive metal on the insulating layer by electroless plating method appropriate for plating selective area or electric plating method.

An alternate embodiment having conductivity types opposite from that of the embodiment of FIG. 1 is also possible. The method of making the alternate embodiment with opposite conductivity types would be similar to the method seen in FIGS. 2a through 2d except that the conductivity types would be the opposite from the method shown in FIGS. 2a through 2d.

As described above, the solar cell is fabricated without using the photo-etching process that is costly and time-consuming, thereby reducing the manufacturing costs.

While this invention has been described in connection with what is presently considered to be the most practical and preferred embodiments, it is to be understood that the invention is not limited to the disclosed embodiments, but, on the contrary, is intended to cover various modifications and equivalent arrangements included within the spirit and scope of the appended claims.

What is claimed is:

1. A method for fabricating a solar cell, comprising the steps of:

forming an emitter layer on a front surface of a substrate;

forming front and rear $SiO_2$ insulating layers on both front and rear surfaces of said substrate;

printing dopant sources on both front for heavily doped emitter layers and rear for back surface field layers on the insulating layers, respectively;

diffusing said dopant sources into the substrate to accommodate forming of the heavily doped emitter layers and back surface field layers; and forming front and rear contact patterns in a chemical etching solution on the front and rear insulating layers, respectively, to expose the heavily doped emitter layers and back surface field layers.

2. The method of claim 1, further comprising the step of forming front and rear contacts on the front and rear insulating layers, respectively, to form the front and rear contacts on heavily doped emitter layers and back surface field layers, respectively.

3. The method of claim 2, said step of forming the front and the rear contact patterns further comprising:

forming phosphosilicate glass at one side of the cell and borosilicate glass layers at another side of the cell by diffusing both phosphorus and boron into the cell at high temperature; and wet-etching phosphosilicate glass and borosilicate glass layers.

4. The method of claim 2, with the front and rear contacts being formed simultaneously.

5. The method of claim 4, with the front and rear contacts being formed by any one of electroless plating and electroplating.

6. The method of claim 1, with the front and rear insulating layers being formed through a thermal-oxidation process.

7. The method of claim 1, with a thickness of each of the front and rear insulating layers being approximately 250 to approximately 750 Angstroms when intially formed.

8. The method of claim 1, further comprised of said printing being screen printing.

9. The method of claim 1, further comprised of said printing being photogravure.

10. The method of claim 3, said phosphosilicate glass having substantially the same width as the heavily doped emitter layers and the borosilicate glass layers having substantially the same width as the back surface field layers.

11. The method of claim 3, with said phosphosilicate glass and borosilicate glass layers are etched a higher etching rate than the insulating layers.

12. The method of claim 3, further comprised of said phosphosilicate glass and borosilicate glass layers etched at an etching rate of 2 to 3 times higher than the insulating layers.

13. The method of claim 1, said step of forming a emitter layer on a front surface of a substrate further comprising an n-type layer formed by diffusing n-type impurities comprising a phosphorus doping source.

14. The method of claim 13, with said phosphorus doping source being a member selected from the group consisting of $POCl_3$ and $P_2O_5$.

15. The method of claim 1, with solar cell comprising:

the substrate of a first conductivity type;

said emitter layer of a second opposite conductivity type formed in a front surface of the substrate of the first conductivity type;

said heavily doped emitter layers of the second opposite conductivity type formed in said emitter layer of the second opposite conductivity type;

said front insulating layer formed on the front surface of the cell, said front insulating layer being provided with first contact patterns exposing the heavily doped region of the second opposite conductivity type, and said first contact patterns having substantially the same width as the heavily doped region of the second opposite conductivity type;

said back surface field layers formed in a rear surface of the cell; and said rear insulating layer formed on the rear surface of the cell, said rear insulating layer being provided with the rear contact patterns exposing said back surface field layers, and having substantially the same width as said back surface field layers.

* * * * *